METHOD FOR ELECTROLESS COPPER PLATING

Filed June 21, 1963

2 Sheets-Sheet 1

METHOD FOR ELECTROLESS COPPER PLATING

Filed June 21, 1963

2 Sheets-Sheet 2

United States Patent Office 3,269,861 Patented August 30, 1966

3,269,861

METHOD FOR ELECTROLESS COPPER PLATING

Frederick W. Schneble, Jr., Oyster Bay, Rudolph John Zeblisky, Hauppauge, John Francis McCormack, Roslyn Heights, and John Duff Williamson, Miller Place, N.Y., assignors to Day Company, N.V., a Curacao corporation Filed June 21, 1963, Ser. No. 289,633
The portion of the term of the patent subsequent to June 25, 1980, has been disclaimed
29 Claims. (Cl. 117—212)

This application is a continuation-in-part of U.S. Serial No. 26,401, filed May 3, 1960, now Patent No. 3,095,-309.

This invention relates to making printed circuits, and more particularly to improvements in providing conductive pathways through insulating panels supporting printed circuits, or to be used to support printed circuits.

It is a primary object of the present invention to provide improved methods of making conductive pathways through insulating panels supporting printed circuits, or to be used to support printed circuits.

It is another object of the present invention to provide improvements in making conductor patterns on an insulation backing, whereby the conductor patterns are rugged and durable.

It is another object of the present invention to provide improvements in making conductor patterns of the type described on both surfaces of an insulating backing.

Still another object of the present invention is to provide improvements in making conductor patterns on both sides of an insulation backing with conductive pathways through the insulation backing.

Other objects of the present invention will become apparent after a reading of the following specification and an inspection of the accompanying drawings, wherein.

According to the process of the present invention, an insulating base member to be formed into a printed circuit member may be provided with an adherent conductive pattern on both surfaces, with the conductive patterns interconnected at selected points by conductive areas which pass through one or more holes or apertures in the base member.

For purposes of illustrating the invention, the so-called print and etch method of making conductive patterns on insulating base members will be described, although it should be understood that other techniques for making the conductive patterns can be also be employed. In other words, the invention is not limited by the particular method of forming the conductor patterns, except as such limitations may appear in the claims.

The improvements described herein, however, give especially advantageous results when employed in combination with the print and etch technique, and the print and etch technique is preferred for use, and forms, in combination with the other steps to be described, a part of the present invention.

Figure 1:
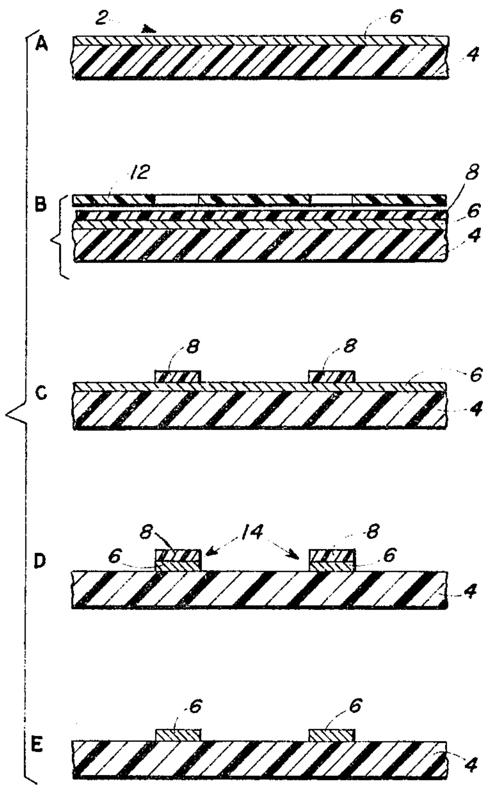
FIGURE 1 is a schematic illustration showing the steps in a typical method of making printed circuits.

The steps in making printed circuits from a metal clad laminate by the so-called print and etch technique is shown schematically in FIGURE 1.

At A in FIGURE 1, there is shown a metal clad laminate indicated generally at 2 and having an insulation core or base 4 covered by a thin metal foil 6.

At B the laminate is printed by means of a step and repeat negative 12 with an acid resist material 8. The appearance of the laminate following printing is shown at C. Following printing, the foil not protected by the acid resist 8 is etched, to form a pattern shown at 14 in FIGURE 1–D. Following etching, the resist 8 is removed to form a conductive pattern of metal foil as shown in FIGURE 1–E.

The printed pattern may be formed on the laminate in a variety of ways.

In the so-called photographic technique, the metal surface is cleaned and degreased, and a light sensitive enamel is uniformly spread over the metal foil and dried. The light sensitive material is sensitive to strong actinic light, such as that from a carbon arc, but may be handled in normal room lighting conditions without adverse effects.

The light sensitive enamels may be, for example, bichromated glues or shellacs, and are well known and understood in the art.

The next step in the photographic process is to print a pattern on the light sensitive enamel. One method of doing so is by the use of a step and repeat negative. This negative is placed over the sensitized metal clad sheet in a vacuum frame which presses it tightly against the sheet. Exposure is made by suitable light source for a suitable period of time, thus hardened the enamel exposed to the light through the negative.

After exposure, the sheet is immersed in a tank of developing solution for about a minute. The developing solution dissolves the light sensitive coating away from those areas of the plate which were under the opaque portions of the negative and were thus not exposed to the light. A typical developer for the light sensitive materials disclosed herein is trichloroethylene. The developer, fo course, will vary with the type of light sensitive enamel employed.

Following development, the plate is immersed in a copper etching solution, such as ferric chloride when the cladding is copper, and the portions of foil not protected by the hard enamel are etched away, to leave the conductive pattern.

Following etching, the exposed light sensitive enamel may be stripped from the panel by immersion in such solvents as methylene chloride, alkali metal base, acetic acid, and the like.

For long production runs, the photographic system of printing is slow and too expensive, and as a result, etch resist printing is ordinarily carried out either by offset printing on an offset printing press or by screen stencil printing on a manual or automatically operative screen printing press. The step and repeat negative is used to produce, in the case of an offset printing press, an offset printing plate. Acid resist ink is transferred by a rubber covered roll from the printing plate to the metal clad base.

In screen printing, the steps and repeat negative is used to produce a stencil on the silk or wire mesh of the screen frame. The stencil is made photographically from the negative and reproduces it exactly.

The offset printing method has the advantage of being faster and using a printing plate that is somewhat more durable than the screen stencil. However, it is disadvantageous in that the quantity of ink that can be transferred from the printing plate via the rubber roller to the metal surface is not very great. Screen printing, on the other hand, puts on a heavy coating of ink entirely satisfactory as an acid resist. Both screen printing and offset printing are currently used commercially.

Any of the above described print and etch techniques may be used in the processes described herein.

Regardless of the type of printing employed, it will be understood that either a positive or a negative image of the desired conducting patterns may be imposed on the base, with suitable modifications to insure that the final conductive pattern desired is ultimately obtained.

When offset or screen stencil printing is employed, the ink used in printing is acid resistant, so that the portions of the metal foil covered thereby are not affected by the etching solution when the plate is contacted therewith. Such acid resistant inks are well understood in the art, and commonly comprise resins such as cellulose acetate, cellulose butyrate, casein-formaldehyde, styrene-maleic anhydride, and the like. Such materials are acid resistant but can be readily removed when desired by readily available solvents or otherwise.

One etching solution commonly used with copper clad stock is ferric chloride. The etching operation is carried out by either blasting the surface of the panel with a fine spray of ferric chloride or immersing the printed sheets, which are held in a rack or on a conveyor, in an agitated tank of ferric chloride. The etching operation is controlled by the concentration of the etching solution and time of contact, and these variable must be carefully controlled empirically for good results. After etching, a water rinsing process is employed to remove all etching chemicals, thereby preventing contamination of the surface or edges of the panel.

Frequently, a bare copper foil circuit is not adequate. If, for example, the circuit pattern is to be used as a switch, slip ring, or commutator, it may be necessary to plate the circuit pattern with silver, nickel, rhodium, gold, and similar highly wear resistant metals. Where it is necessary to solder lugs or other hardware to the pattern, it may be advisable to have the conductor pattern solder plated.

When the plate contains apertures, serving as crossover connections from the top to the bottom of the plate, plated thru holes have been conventionally formed by electrodeposition of copper.

Electroplating of copper, both on the surfaces of the foil and in the holes, however, has many disadvantages.

In electroplating, the plate is immersed as the cathode in an electroplating bath. All segments of the conducting pattern desired to be plated must obviously be interconnected. With mass production techniques, this is not always possible, or desirable.

Also, the potential on various components of the circuit will vary from area to area of the board, with the greatest potential occurring at the edges of the panel and the lowest potential occurring towards the central regions of the panel.

In electroplating, the greatest deposit of metal occurs at the points of highest potential because the current density is highest at these points. This results in thick deposits at the edges of the panel and thin deposits in the center.

So far as the holes are concerned, rather than getting a uniform deposit of electroplated metals over the edges of the hole and on the insulation surrounding the holes, the electroplated metal has a tendency to build up along the edges of the hole on both surfaces of the panel and to form a thick deposit around the edges.

The plating on the lateral walls of the insulation surrounding the holes diminishes from the surface towards the central part of the insulating lamina. Thus, electroplating results in a bulge at the top and bottom of the holes, and extremely thin deposits or no deposit at all towards the center of the lateral walls of insulation surrounding the holes.

For the foregoing reasons, it is extremely difficult, if not impossible, to control the size of plated thru holes when electrodeposition is employed. As a result, the size of the holes drilled or punched in the stock bears little, if any, relationship to the size of the holes following electrodeposition. This makes close tolerance of hole sizes an impossibility.

Of course, when electroplating is employed, it is also necessary to render the area of insulation material surrounding the holes conductive prior to electroplating, if plated thru holes of any type are desired. Rendering these areas conductive is costly and time consuming, and does not lend itself readily to mass production techniques.

Additionally, when electroplating is employed prior to etching, because of the non-uniformity of deposits, the portions in the center of the circuit are over-etched while those at the edges of the circuits are apt to be underetched. Thus, an etching process severe enough to remove the thick deposits along the edges of the panel is likely to eat into the lateral sides of the metal foil making up the conductor pattern towards the center of the panel. Unless costly precautions are taken, accordingly, the pattern in the center areas of the board tends to be fragile, thereby leaving the circuit vulnerable to breaks.

These and other disadvantages of electroplating are overcome by the processes disclosed herein.

The improvements according to the present invention lead to the simple, facile and rapid production of rugged printed conductor patterns on both sides of an insulating base, with superior plated through holes or cross-overs between the top and bottom surface of the plate.

According to one embodiment of the present invention, a printed circuit is imposed by any of the standard techniques on an insulating panel. The entire panel is then coated with an acid resist material, as for example, cellulose acetate or butyrate, casein-formaldehyde resin, styrene maleic anhydride resin, and the like. Any acid resist material which can be later readily removed may be used as the coating. The important property of the coating so far as this embodiment is concerned is that it be able to withstand attack by the sensitization solution. Holes defining cross-overs in the printed circuits are then drilled or punched or otherwise provided in the panel. Desirably, the holes are surrounded by areas of conducting material on both surfaces, which area will be referred to as lands. The lands of course will be covered by the acid resist coating. The panel is then sensitized as will be described hereinafter, to thereby render the walls of the insulation panel surrounding the apertures sensitive to receiving an electrolessly deposited layer of copper. Following sensitization, the inert coating is removed, as by dissolving in a solvent or otherwise. After removal of the coating, the surface of the conductor pattern may be cleaned or deoxidized, if necessary, using any of the cleaning or deoxidizing techniques described herein. The panel is then immersed in the improved electroless copper plating bath to be described, and a ductile electroless copper thereby deposited on the metal foil, and on the lateral walls of the insulation material surrounding the apertures, including the lands.

The electroless depositing step to be described herein forms a uniform layer of electroless copper on the lateral walls surrounding the apertures and may also form a right angle bend, almost perfect, at the juncture of the surface of the panel and the lateral wall of the panel surrounding the apertures. Additionally, the electroless copper depositing step builds up an adherent deposit of copper on the conducting circuit pattern, thereby rendering the conducting pattern extremely rugged.

Figure 2:
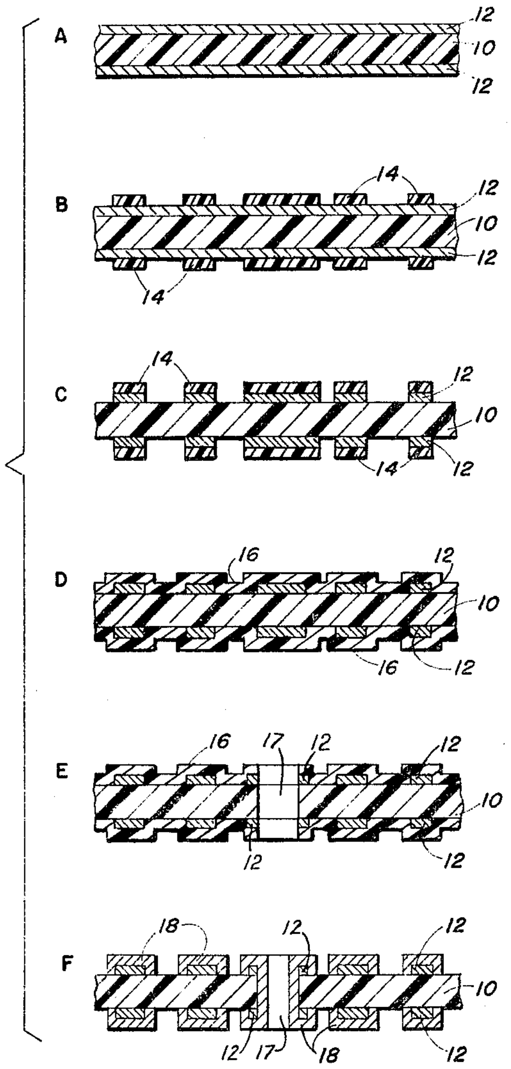
FIGURES 2, 3 and 4 are schematic illustrations showing the steps in making printed circuits according to various embodiments of the present invention.

The steps in a suitable process for making printed circuits with plated through holes according to the embodiment under discussion are described schematically in FIGURE 2.

In FIGURE 2–A is shown the insulation stock 10 clad on both surfaces with metal foil 12. At B, a positive pattern of the desired circuit has been imposed on the panel with an etch resistant ink 14. In FIGURE 2–C, the panel has been etched to remove the copper foil in those areas not covered by the etch resist ink. In FIGURE 2–D, the etch resist 14 has been removed and the panel has been coated on both surfaces with an acid resist coating 16. Holes or apertures 17 are then punched or drilled in the panel as shown in FIGURE 2–E. The panel is then sensitized as will be described hereinafter, and following sensitization, the acid resist coating 16 is removed. The panel is then subjected to electroless deposition for a suitable period of time to form an adherent deposit of electroless copper 18 on the metal foil 12 forming the conductor pattern and on the lateral sides of the panel surrounding the holes, as shown in FIGURE 2–F.

According to a modified embodiment of the present invention, the metal clad stock, for example, copper clad stock, provided with apertures at the proper locations defining crossovers is sensitized as will be described hereinafter to make the lateral walls of the insulating material surrounding the apertures as well as the copper foil covering the stock sensitive to receiving an electrolessly deposited layer of copper. Following sensitization, the stock is immersed in an electroless plating bath, also to be described hereinafter, and thin uniform deposits of electroless copper thereby formed on the conducting portions of the circuit, including the areas of insulation surrounding the holes or cross-overs and on the lands.

Following these pre-treatment steps, the base or stock material is coated with a light sensitive enamel such as "Powerplate" or KPR from Eastman Kodak. The light sensitive enamel is exposed to actinic light through a negative thus hardening the enamel in the holes and in a circuit pattern on the surface. After developing the image the pattern is etched as described hereinabove to form the desired printed circuit.

Figure 3:
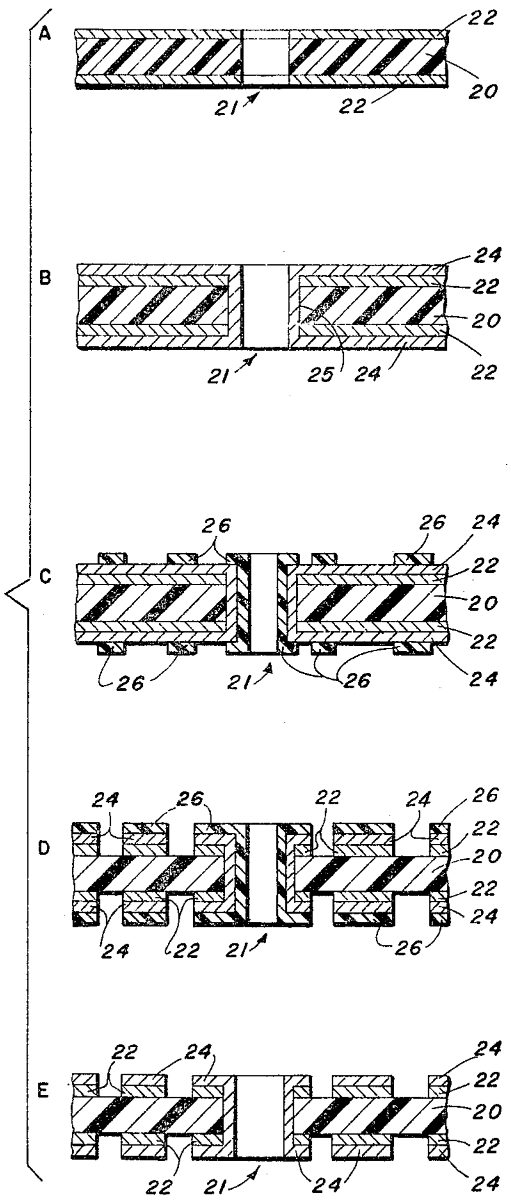

This embodiment of the present invention is described schematically in FIGURE 3.

In FIGURE 3–A is shown the insulation stock 20 clad on both surfaces with metal foil 22. At B, the metal clad stock containing apertures 21 has been sensitized using the solutions disclosed herein, and has been electrolessly plated to form a thin uniform deposit of electroless copper 24 on the foil and on the lateral wall 25 surrounding the hole. At C, the plate has been printed with an etch resist pattern 26 using the photographic technique described hereinabove. The etch resist 26, it will be noted, extends through the holes 21 and protects the electroless copper deposit 24 in the holes. At D, the plate has been etched to form the circuit pattern with plated through holes, and in FIGURE 3–E the etch resist pattern 26 has been removed to form the completed circuit.

According to an alternative form of the present invention, stock clad on both sides with metal foil, such as copper foil, and provided with apertures defining crossovers between the top and bottom surface of the plate is sensitized for the reception of electroless copper. The panel is then printed and etched by standard procedures described hereinabove. The etch resist is removed, and the plate with the conducting pattern is then subjected to electroless copper deposition.

Figure 4:
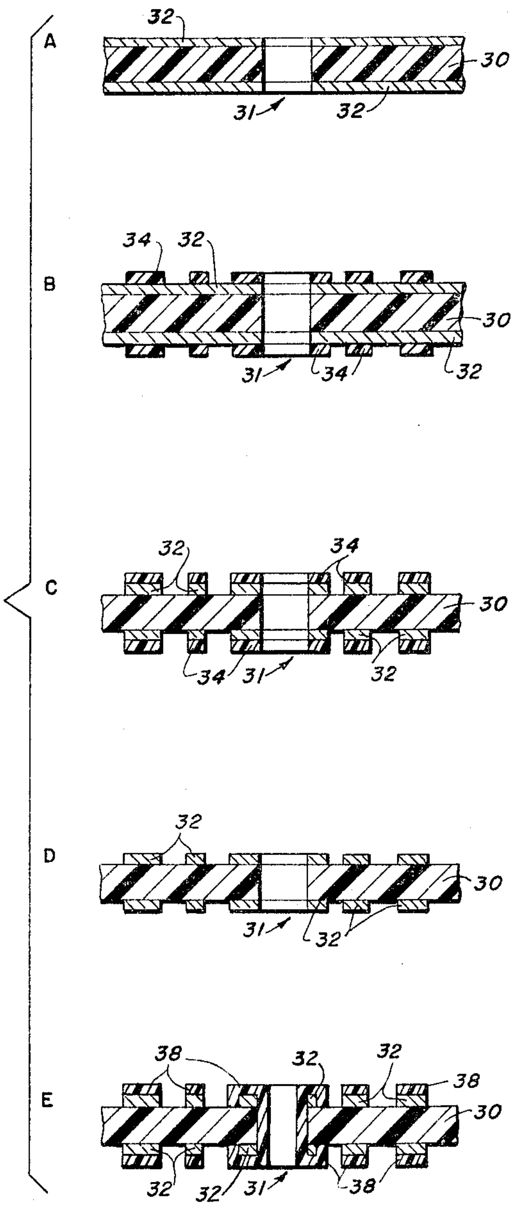

The alternative method of forming the printed circuits is shown schematically in FIGURE 4.

In FIGURE 4–A is shown the insulation material 30 clad on both sides with metal foil 32 and provided with apertures 31. The panel is sensitized and then printed with a positive pattern of etch resist 34 as shown in FIGURE 4–B. Following printing, the plate is etched to leave the conductive portions of the pattern intact, the remaining portion of the foil having been etched away as shown in FIGURE 4–C. The etch resist 34 is then removed so that the panel looks as shown at D in FIGURE 4. Following removal of the etch resist, the panel is immersed in the electroless plating bath, thereby forming a uniform deposit of electroless copper 38 on the foil 32 and through the holes as is shown in E. The deposit 38 in the holes and on the lands surrounding the holes is uniform, as is also shown in FIGURE 4–E.

Sensitization solutions which may be used in carrying out the process described herein will now be described.

In order to make printed circuits by the techniques described herein, as will be clear from the foregoing, it is necessary to deposit adherent electroless copper uniformly on the foil constituting the conductor pattern, and on the lateral walls of the insulation core surrounding the apertures. The walls surrounding the apertures are formed of non-conductive insulating material, such as nylon, polystyrene, melamine resin, cast epoxy resin, and the like.

Sensitizing baths are employed to render the insulating walls surrounding the apertures sensitive to reception of an electroless copper deposit.

Sensitization may be accomplished by immersing the panel in acidic aqueous solutions of stannous chloride followed by immersion in acidic aqueous solutions of precious metal ions, such as palladium chloride.

Alternatively, acidic aqueous solutions comprising an admixture of stannous chloride and precious metal ions may be used.

The acidic aqueous solutions may have a pH of between about 1 and 5, with pH of about 2.5 appearing to be optimum.

The concentration of stannous tin ion in the acidic sensitizing solutions may vary between about 0.5 and 10 percent by weight, with particularly good results being achieved at a concentration of between about 3 and 7 percent. The concentration of the precious metal ion may vary between about 0.10 and 5 weight percent or more. When a single sensitizing solution containing both stannous tin ions and precious metal ions is employed, the solution will preferably have an excess of stannous tin ions, based upon the amount of precious metal ions present.

In addition to palladium, other precious metal ions that may be used in the sensitization baths include platinum, gold, rhodium, osmium, iridium, and mixtures of the foregoing.

In using the precious metal baths, care should be taken to avoid a flash of non-adherent precious metal on the copper surface to which electroless copper is deposited. Alternatively, a non-adherent flash of precious metal, if it occurs, may be removed, as by a mild abrasion treatment, prior to electroless copper deposition.

In either event, the copper surface on which electroless copper is to be deposited should be free of weakly adhering precious metal. When a weakly or non-adherent precious metal flash is present, it has been discovered that the adherence of the electrolessly deposited copper to these surfaces is extremely poor. Of course, if an adherent coating of precious metal could be obtained, the resulting base would be satisfactory for electroless copper deposition.

To prevent the precious metal from flashing, suitable wetting or surface active agents may be added to the baths, or the precious metal bath may be suitable buffered to avoid flashing.

The treatment to be afforded the surface to be plated depends upon the cleanliness of the material to be treated and associated factors. Thus, where the surface to be plated is either unclean or its cleanliness uncertain, the first step in the procedure for effecting deposition of adherent electroless copper is to clean throughly the article or panel upon which plating is to occur. This is desirably accomplished by scrubbing of the panel with pumice or the like to remove heavy soils; rinsing with water; and subsequent removal of soiling due to organic substances from the panel and apertures defined therein with a suitable alkali cleaning composition. A typical alkaline cleaner composition is as follows:

| | G./l. |
|---|---|
| Sodium isopropyl naphthalene sulfonate | 3 |
| Sodium sulfate | 1 |
| Sodium tripolyphosphate | 14 |
| Sodium metasilicate | 5 |
| Tetrasodium pyrophosphate | 27 |

Cleaning with alkaline solutions is desirably performed at a temperature of 160°–180° F. The surfaces to be plated are permitted to remain in the alkaline bath for a period of 5–30 minutes. Other suitable alkali cleaning compositions, such as conventional soaps and detergents, may also be used. Care should be used in selecting the detergent to insure that the specimen to be treated is not attacked by the cleaner.

Oxides may be removed from the panel surfaces and apertures by application thereto of a dilute acid solution such as dilute sulfuric or hydrochloric acid, or of a light etching solution such as a 25 percent solution of ammonium persulfate in water, as is described in bulletin #86 of the Becco Chemical Division of the Food Machinery and Chemical Corporation, Buffalo 7, New York. The surface oxides may also be removed by application of other suitable etchants such as a solution containing about 2 moles of cupric chloride in 4 molar aqueous hydrochloric acid. The slight etch treatments with such solutions should not exceed 2 to 3 minutes. The treatment period and temperature are significant, particularly where the panel surfaces are formed of a conductive metal, in that elevated temperatures and extended periods of time beyond those described may result in removal not only of the oxide materials but of the conductive metal, such as copper foil, forming the surfaces of the panel or the conductive pattern. The panel is rinsed thoroughly after this cleaning step with water to remove all semblance of etching compounds. Care should be taken to avoid the formation of further oxide film during rinsing or as a result of air oxidation. Subsequent to rinsing, the panel may be treated with a hydrochloric acid solution formulated of about 42 fluid ounces of hydrochloric acid (37%) per gallon of water for a period of from 2 to 5 minutes. From this bath, the panel may be placed in the electroless copper depositing baths to be described hereinbelow.

If the shape of the materials permits, a sanding operation with a fine abrasive can also be used to remove oxides.

A typical method of sensitizing the panels described herein for the reception of electroless copper will now be described in the following example.

*Example 1*

A laminate having a conductor pattern imposed thereon, the conductor pattern being masked by an acid resistant ink, is employed as the panel to be sensitized. Such a panel is illustrated in FIGURE 2–E, described hereinabove.

The panel is rinsed and soaked in an acidified stannous chloride solution having the following composition:

| | G. |
|---|---|
| Stannous chloride | 50 |
| Hydrochloric acid (12 N) | 30 |
| Water, enough to make 1 liter. | |

The soak in stannous chloride is continued for 10 minutes, and is followed by a rinse first in dilute hydrochloric acid and then in water. The panel is then soaked in the following palladium chloride solution for 2 minutes:

| | |
|---|---|
| Palladium chloride, g./l. | 20 |
| Hydrochloric acid (12 N), ml./l. | 20 |
| Water | Remainder |

After thorough rinsing and removal of the acid resist ink, the panels are ready for electroless copper deposition as will be made more clear by Example 10.

Electroless plating baths preferred for use in the present invention consist essentially of a soluble copper salt (e.g., copper sulfate, cupric chloride, cupric nitrate, cupric acetate, and the like); a complexing agent for the cupric ions (e.g., Rochelle salts; ethylene diamine tetraacetic acid and its sodium salt; nitrilotriacetic acid and salts thereof; N-hydroxyethylethylenediamine triacetate; triethanolamine; sugar, including sucrose, dextrose, lactose, levulose or maltose; mannitol; sorbitol, gluconic acid and the like); an alkali or alkaline earth metal hydroxide, such as sodium or potassium hydroxide; an active reducing agent such as formaldehyde; and a small amount of a complexing agent for cuprous ion, such as cyanide salts, e.g., sodium and potassium cyanide, lactonitrile, glyconitrile, thiourea, allyl alcohol, and ethylene. Preferred for use as the complexing agent for cuprous ion are the cyanide salts, such as sodium and potassium cyanide, lactonitrile, and glyconitrile.

The quantities of the various ingredients in the bath are subject to wide variation, within certain ranges which may be defined as follows:

Copper salt from 0.5 g. to saturated solution (0.002 to .15 mol. or more)
Alkali metal hydroxide to give pH 10.5 to 14
Formaldehyde 0.06 to 3.4 mol.
Complexing agent for cupric ion 0.5 to 2.5 times moles of copper
Complexing agent for cuprous ion (0.00002 mol. to 0.06 mol.)
Water—sufficient to make 1 liter.

The ratio of the copper salt to the complexing agent for cupric ion should be such that there are from 0.5 to 2.5 as many moles of cupric complexing agent as of copper, e.g., 5 grams of $CuSO_4$—$5H_2O$ requires from 2.8 to 14.1 grams of Rochelle salts.

Sodium hydroxide and sodium cyanide are preferred over the corresponding more costly potassium and other alkali metal salts, which are of greater molecular weight.

Rochelle salts, the sodium salts (mono-, di-, tri-, and tetrasodium salts) of ethylenediamine tetraacetic acid, nitrilotriacetic acid and its alkali salts, gluconic acid, gluconates, and triethanolamine are preferred as cupric ion complexing agents, but commercially available glucono—δ—lactone and modified—ethylenediamineacetates are also useful, and in certain instances give even better results than the pure sodium ethylenediaminetetraacetates. One such material is N-hydroxyethylethylenediamine triacetates.

Cupric sulfate is preferred as the copper salt, but other soluble copper salts may be used, such as the nitrate, chloride and acetate.

In considering the general formulae for the electroless copper baths and the specific working formulae which are set forth below, it should be understood, that as the baths are used up in plating, the cupric salt, and the formaldehyde reducing agent may be replenished from time to time, and also that it may be advisable to monitor the pH and cuprous ion complexing agent content of the bath, and to adjust these to their optimum value as the bath is used.

The baths are ordinarily used at slightly elevated temperatures, such as from 35° to 65° C. although many of them may be used at even higher temperatures. As the temperature is increased, it is usual to find that the rate of plating is increased, and that the ductility of the deposit is increased to a slight extent, but the temperature is not highly critical, and within the usual operating range, excellent deposits are produced which exhibit greatly improved properties over those obtained with conventional baths.

With electroless copper plating baths used herein, the efficiency of copper recovered by electroless deposition from the bath often exceeds 90%, which is much greater than has heretofore been observed in working with conventional baths.

The cuprous ion complexing agent in the bath is an important feature and serves to prevent or minimize the formation of cuprous oxide in the bath, and also appears to inhibit the formation of resulting hydrogen in the electroless deposited metal. Without the cuprous ion complexing agent, e.g., cyanide and the like, the bath has been found to be unsatisfactory as a stable plating solution, and the electroless copper deposit has been found to be smudgy and of a poor appearance on the surface opposite the adhering base. Additionally, it has been discovered that without the cuprous ion complexing agent, a ductile deposit of electroless copper is not obtained.

The baths to be described herein will ordinarily deposit a coating of electroless copper of a thickness of about 1 mil, within between about 10 and 100 hours, depending on the composition, pH, temperature, and related factors.

Examples of the electroless copper depositing baths suitable for use will now be described.

*Example 2*

| | Moles/l. |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55° C., and will deposit a coating of ductile electroless copper about 1 mil thick in about 51 hours.

Other examples of suitable baths are as follows:

*Example 3*

| | Moles/l. |
|---|---|
| Copper sulfate | 0.02 |
| NaOH | 0.05 |
| NaCN | 0.0002 |
| Trisodium N - hydroxyethylethylenediamine-triacetate | 0.032 |
| Formaldehyde | 0.08 |
| Water | Remainder |

This bath is preferably operated at a temperature of about 56° C., and will deposit a coating of ductile electroless copper about 1 mil thick in about 21 hours.

*Example 4*

| | Moles/l. |
|---|---|
| Copper sulfate | 0.02 |
| NaOH | 0.125 |
| NaCN | 0.0002 |
| HCHO | 0.47 |
| Rochelle salt | 0.0425 |
| Water | Remainder |

*Example 5*

| | Moles/l. |
|---|---|
| Copper sulfate | 0.04 |
| NaOH | 0.19 |
| NaCN | 0.0002 |
| Rochelle salt | 0.0425 |
| HCHO | 0.47 |
| Water | Remainder |

*Example 6*

| | Moles/l. |
|---|---|
| Copper sulfate | 0.04 |
| NaOH | 0.19 |
| NaCN | 0.0006 |
| HCHO | 0.47 |
| Rochelle salt | 0.0425 |
| Water | Remainder |

*Example 7*

| | Moles/l. |
|---|---|
| Copper sulfate | 0.04 |
| Sodium hydroxide | 0.19 |
| NaCN | 0.0002 |
| HCHO | 0.47 |
| Rochelle salt | 0.064 |
| Water | Remainder |

*Example 8*

| | Moles/l. |
|---|---|
| Copper sulfate | 0.02 |
| NaOH | 0.125 |
| NaCN | 0.0002 |
| HCHO | 0.40 |
| Sodium citrate | 0.051 |
| Water | Remainder |

*Example 9*

| | Moles/l. |
|---|---|
| Copper sulfate | 0.02 |
| NaOH | 0.05 |
| NaCN | 0.0002 |
| HCHO | 0.1 |
| Trisodium N-hydroxy ethylenediaminetriacetate | 0.024 |
| Water | Remainder |

The following examples are illustrative of the improved methods of making printed circuits according to the teachings herein contained.

*Example 10*

Printed circuits with plated through holes were made following the procedures outlined in FIGURE 2.

An epoxy resin impregnated glass cloth laminate having copper foil about 0.00135 inch thick bonded on each surface was employed. A print and etch circuit was imposed on both sides of the laminate by screen printing a positive image of the conductor pattern on the surfaces, and then etching with a ferric chloride solution. The ink used was casein-formaldehyde resin. Following etching, the etch resist ink was removed by immersion in a dilute solution of sodium hydroxide. The panel was then coated on both sides with celluloses acetate, and following drying, holes were punched therein at points defining cross-overs between the circuits on the two surfaces of the panel. The panel was then treated following the procedure of Example 1 to sensitize the lateral walls of the panels surrounding the apertures. The coating was then removed and following water rinsing and cleaning, the panel was immersed in the electroless plating bath of Example 2 until an adherent layer of electroless copper was deposited over the foil forming the conductor pattern and on the lateral walls of the panel surrounding the apertures. The finished panel had the appearance of that shown in FIGURE 2.

The following example illustrates an alternate procedure suitable for use when it is desired to produce circuits having a permanent solder mask.

*Example 11*

Following the procedure of Example 10, a print and etch circuit was imposed on an epoxy resin impregnated glass cloth laminate clad on both sides with copper foil. Holes were then punched in the panel at designated areas defining cross-overs between the circuits on the panel surfaces.

The panel was then treated to sensitize the lateral walls of the panel surrounding the apertures. To this end, the panel was immersed in a stannous chloride solution having the following composition for about 5 minutes:

| | |
|---|---|
| Stannous chloride, g./l. | 50 |
| Hydrochloric acid (37%), ml./l. | 25 |
| Water, to make 1 liter. | |

The panel was then rinsed first in dilute hydrochloric acid and then in water, and following rinsing immersed in the following solution for about 7 minutes:

| | |
|---|---|
| Palladium chloride, g./l. | 0.1 |
| Hydrochloric acid (37%), ml./l. | 20 to 25 |
| Triton X100, ml./l. | 1 |
| Water, enough to make 1 liter. | |

Triton X100 is a product of Rohm & Haas Company, Philadelphia, Pennsylvania. It is an octyl phenyl ether of polyethylene glycol containing 9–10 ethoxy groups per molecule. It is a surface active or wetting agent, whose function is to prevent the palladium from flashing on the copper foil.

After sensitizing, the panel was screen printed with a permanent solder mask, leaving the holes and lands exposed. The solder mask had the following composition:

| | |
|---|---|
| Epon 828, g. | 52 |
| Naphtha, g. | 25 |
| Methyl isoamyl ketone, g. | 12 |
| Cyclohexanone, g. | 8 |
| Bentone-27, g. | 2.3 |
| Ethanol, g. | 0.7 |
| Epoxy resin curing agent | 10 |

Epon 828 is an epoxy resin sold by Shell Chemical Company. It is a diglycidal ether formed by the reaction of bisphenol A and epichlorohydrin, and has an epoxide equivalent of between about 175 and 210, and an average molecular weight of 350 to 400. The epoxy resin curing agent used was curing agent "Z" sold by Shell Chemical Company, which is believed to be a polyamine of the meta-phenylene diamine type.

Bentone 27 is a modified bentonite sold by National Lead Company, and is used as a filler for the epoxy resin composition.

The solder mask was cured at about 127° C. for about two hours.

The above permanent solder mask composition, it should be noted, is only typical of many permanent masks which could be used.

The panel was then cleaned by immersion for about 15 minutes in an alkaline cleaner having the following composition:

| | G./l. |
|---|---|
| Sodium isopropyl naphthalene sulfonate | 3 |
| Sodium sulfate | 1 |
| Sodium tripolyphosphate | 14 |
| Sodium metasilicate | 5 |
| Tetrasodium pyrophosphate | 27 |

Following water rinsing, the panel was immersed for 2 to 3 minutes in an acid dip comprising 42 fluid ounces of hydrochloric acid (37%) per gallon of water.

The panel was then given an electroless copper strike by immersion for about 15 minutes in the following bath:

| | |
|---|---|
| Copper sulfate, g./l. | 15 |
| Rochelle salt, g./l. | 15 |
| Sodium hydroxide, g./l. | 15 |
| Formaldehyde (37%), m./l. | 35 |
| Water | Remainder |

The panel was then immersed in the bath of Example 2 for about 51 hours at about 55° C. to deposit ductile electroless copper on the lateral walls surrounding the apertures and on the lands.

*Example 12*

Printed circuits were made following the procedures outlined in FIGURE 3 and described hereinabove.

An epoxy resin impregnated glass cloth laminate having a copper foil about 0.00135 inch thick bonded on each surface was drilled or punched at pre-selected areas to produce holes defining cross-over points in the intended circuit. The laminate was cleaned and sensitized according to the procedure of Example 11. Following sensitization, the panel was thoroughly rinsed with water.

The plate was then immersed in the electroless copper depositing bath of Example 2 until a uniform adherent deposit of electroless copper was formed over the foil and on the surfaces of the insulation core surrounding the holes. The electroless copper formed practically a perfect right angle bend at the juncture of the surface of the panel and the holes.

The plate, including the lateral walls surrounding the holes, was then coated with Powerplate, which, as indicated hereinabove, is a bichromated shellac sensitive to actinic light sold by Chemco Photo Products Co., Inc. The plate was then exposed to actinic light through a negative, thus hardening the light sensitive enamel in the holes and in a circuit pattern on the surface.

After developing the image with Powerplate developer, the plate was etched by steeping in a ferric chloride solution, and the hardened enamel then removed from the conductor pattern, including the holes, by immersion in a dilute sodium hydroxide solution. The completed panel in cross-section looked like that depicted in FIGURE 3–E.

*Example 13*

A base material (epoxy resin impregnated glass cloth laminate) clad on both sides with foils of copper about 0.00135 inch thick was provided with holes defining crossovers. The panel was cleaned and the holes sensitized following the procedure of Example 11. The plate, including the holes, was then coated with light sensitive enamel of Example 12. The plate was then exposed to actinic light through a negative, thus hardening the light sensitive enamel in the holes and in a circuit pattern on the surface.

After developing the image in Powerplate developing solution, the plate was etched by steeping in a ferric chloride solution, and the hardened enamel then removed from the conductor pattern, including the holes, by immersion in a dilute sodium hydroxide solution.

Following water rinsing, the panel was given an electroless copper strike of 10–20 minutes duration by immersion in the strike solution of Example 11.

The panel was then immersed in an electroless copper bath having the formula of Example 2, and permitted to remain in the bath until an adherent deposit of electroless copper had formed on the surface areas and on the surfaces of insulating base surrounding the holes. The circuit formed had the appearance of that shown in FIGURE 4–E. The electroless deposit of copper in the holes was uniform and extremely tenacious; and the resulting circuit was extremely rugged.

As indicated hereinabove, an additional metal may be deposited on the circuits described herein to impart special properties thereto.

In another embodiment of the invention, for example, an insulating panel clad on both sides with copper foil is drilled, sensitized and electroless copper plated following the procedure of Example 12. The copper surface is then activated for reception of electroless nickel by treating, for example, with a hot aqueous solution of palladium chloride having a palladium chloride concentration of between about 0.01 and 1.0 g./l. The panel, following rinsing, is then silk screened with a resist ink of the type described hereinabove, to leave only the circuit pattern exposed. Since the holes form part of the circuit pattern, these will also be exposed, The panel is then plated with electroless nickel, as, for example, according to the procedures disclosed by Brenner in Metal Finishing, November 1954, pages 68 to 76; ibid, December 1954, pages 61 to 68. The nickel deposit may be followed, if desired, by an electroless gold deposit, using the procedure described, for example, in U.S. Patent 2,976,181, or by some other method.. After this, the silk screen resist is removed, and the panel etched, with ferric chloride, to form a conductor pattern including conducting holes, made up successively of copper foil, electroless copper, electroless nickel, and electroless gold. Since the gold is not attacked by the ferric chloride etch, there is no need in the embodiment to take any special precautions to protect the lateral surfaces of the holes from attack by the etchant. Alternatively in this embodiment, the palladium chloride treatment may be omitted and the additional metal electroplated. For example, the panel can be silk screen printed and then electroplated with whatever metal is desired, e.g., nickel, gold, silver, rhodium, and aluminum, including successive electroplating of two or more additional metals. The silk screen resist is then removed and the panel then etched.

In either of these embodiments, the additional metal serves to mask the holes during the etching operation and, additionally, forms a part of and imparts special characteristics to the printed circuit.

Likewise, using the procedure of Example 13, additional metal, such as nickel, gold, silver, rhodium, and the like, may be electrolessly deposited or electroplated on the finished circuit of the type shown, for example, in FIGURE 4–E.

Typical electroless nickel baths which may be used to deposit the additional metal are described in Brenner, "Metal Finishing," November 1954, pages 68 to 76, and comprise acidic aqueous solutions of a nickel salt, such as nickel chloride; an active chemical reducing agent for the nickel salt, such as the hypophosphite ion; and a complexing agent, such as carboxylic acids and salts thereof. Electroless gold plating baths which may be used to deposit additional metal are disclosed in U.S. 2,976,181, and contain a slightly water soluble gold salt, such as gold cyanide, a reducing agent for the gold salt, such as the hypophosphite ion, and a chelating or complexing agent, such as sodium or potassium cyanide.

The hypophosphite ion may be introduced in the form of hypophosphorous acid and salts thereof, such as the sodium, calcium and the ammonium salts.

The purpose of the complexing agent is to maintain a relatively small portion of the gold in solution as a water soluble gold complex, permitting a relatively large portion of the gold to remain out of solution as a gold reserve. The pH of the bath will be about 13.5, or between about 13 and 15, and the ion ratio of hypophosphite radical to insoluble gold salt may be between about 0.33 and 10 to 1.

*Example 14*

Following the procedure of Example 12, an epoxy impregnated glass cloth laminate clad on both sides with copper foil is drilled, sensitized, and electroless copper plated using the electroless copper depositing bath of Example 2.

The panel is then immersed in a hot aqueous solution containing about 1 g./l, palladium chloride.

The panel is then silk screen printed with an acid resist cellulose acetate ink, leaving only the desired circuit pattern and the holes exposed.

The panel is then plated with electroless nickel by immersion in the following bath:

| | |
|---|---|
| Sodium acetate, m./l. | 0.120 |
| Sodium hypophosphite, m./l. | 0.224 |
| Nickel chloride, m./l. | 0.09 |
| Water | Remainder |

Following washing, the panel is then plated with electroless gold by immersion in the following bath at about 96° F.:

| | G./l. |
|---|---|
| AuCN | 2.0 |
| $NaH_2PO_3 \cdot H_2O$ | 10.0 |
| KCN | 0.2 |
| pH | 13.5 |

In this case, the gold is the etch resist. Therefore, the silk screen etch resist is removed, and the portions of the panel not protected by the gold deposit are then etched by immersion in a ferric chloride solution.

*Example 15*

An epoxy resin impregnated glass cloth laminate having a copper foil about 0.00135 inch thick bonded on each surface was drilled or punched at pre-selected areas to produce holes defining cross-over points in the intended circuits. The laminate was cleaned and sensitized according to the procedure of Example 11.

The panel was then screened with a temporary mask, leaving the lands and holes exposed, and then immersed in the electroless copper bath of Example 3 to deposit a uniform ductile, deposit of electroless copper on the lateral walls surrounding the holes and on the lands.

The lands and lateral walls of the panels were then coated with electroless gold by immersing the panel in the electroless gold bath of Example 14. The electroless gold deposit served as an etch resist for the lands and the walls surrounding the holes.

The temporary mask was then stripped off, and the panel screen printed with a permanent solder mask having the composition described in Example 11 to define a conductor pattern.

The panel was then etched by steeping in a ferric chloride solution to remove copper in those areas not covered by the permanent solder mask or electroless gold. The electroless gold as indicated, served as an etch resist for the lands and the lateral walls defining the holes. The resulting printed circuit had a conducting pattern covered by a permanent solder mask, with the lands and holes exposed.

If desired, the resulting circuit could be dip soldered by immersion in a molten solder bath. The solder, of course, would deposit only on the lands and the holes, since the remainder of the conductor pattern is completely covered by the solder mask.

Although in the above examples and description, printed circuits on both sides of the panel with plated through holes have been described, it should be understood that the techniques described herein are equally applicable to prepare panels with circuits on one side only, and with or without conductive passageways through the panels.

The invention in its broader aspects is not limited to the specific processes shown and described but departures may be made therefrom within the scope of the accompanying claims without departing from the principles of the invention and without sacrificing its chief advantages.

What is claimed:

1. A method of making conductive passageways in an insulating member which comprises providing apertures in the member; sensitizing the lateral walls of the member surrounding the apertures to the reception of electrolessly deposited copper; and electrolessly depositing copper on the lateral walls surrounding the apertures by immersion in an electroless copper plating bath consisting essentially of: water; a water soluble copper salt, from about 0.002 to 0.15 mole per liter; a copper complexing agent for cupric ion, from about 0.5 to 2.5 times the moles of copper salt, an alkali metal hydroxide, sufficient to give a pH of between about 10.5 to 14; formaldehyde, from about 0.06 to 3.4 moles per liter; and a complexing agent for cuprous ion from about 0.00002 to 0.06 mole per liter.

2. The method of claim 1 wherein the complexing agent for cuprous ion is a member selected from the group consisting of cyanide salts, α-hydroxy nitriles, thiourea, allyl alcohol and ethylene.

3. The method of claim 1 wherein the α-hydroxy nitrile is a member selected from the group consisting of lactonitrile and glyconitrile.

4. In a process for making printed circuits on both sides of an insulating member with conductive passageways between the top and bottom surfaces of the member; the improvements which comprise providing aperthres in the insulating member; sensitizing the lateral walls of the member surrounding the apertures to the reception of electrolessly deposited copper and electrolessly depositing copper on the lateral walls of the member surrounding the apertures by immersion in an electroless copper plating bath consisting essentially of: water; a water soluble cooper salt, from about 0.002 to 0.15 mole per liter; a complexing agent for cupric ion, from about 0.5 to 2.5 times the moles of copper salt; an alkali metal hydroxide, sufficient to give a pH of between about 10.5 to 14; formaldehyde, from about 0.06 to 3.4 moles per liter; and a complexing agent for cuprous ion, from about 0.00002 to 0.06 mole per liter; and then imposing a predetermined conductor pattern on at least one surface of the panel.

5. In a process for making printed circuits on at least one surface of a member having conductive areas on at least one surface and an insulating core, with conductive passageways between the surfaces, the improvements which comprise providing apertures in the member; sensitizing the lateral walls of the member surrounding the apertures for reception of electrolessly deposited copper; imposing a predetermined pattern on the surfaces of the panel; and electrolessly depositing copper on the pattern and on the lateral walls surrounding the apertures by immersion in an electroless copper depositing bath consisting essentially of: water; a water soluble copper salt, from about 0.002 to 0.15 mole per liter; a complexing agent for cupric ion, from about 0.5 to 2.5 times the moles of copper salt; an alkali metal hydroxide sufficient to give a pH of between about 10.5 to 14; formaldehyde, from about 0.06 to 3.4 moles per liter; and a complexing agent for cuprous ion, from about 0.00002 to 0.06 mole per liter.

6. In a method of making printed circuits on a member clad on at least one surface with a metal foil and having an insulating core; the improvements which comprise providing apertures in the panel; sensitizing the lateral walls of the member surrounding the apertures for reception of electrolessly deposited copper by treating with acidic aqueous solutions of stannous tin ions and precious metal ions; electrolessly depositing copper on the foil and on the lateral walls of the member surrounding the apertures by immersion in a bath consisting essentially of: water; a water soluble copper salt, from about 0.002 to 0.15 mole per liter; a complexing agent for cupric ion, from about 0.5 to 2.5 times the moles of copper salt; an alkali metal hydroxide, sufficient to give a pH of between about 10.5 to 14; formaldehyde from about 0.06 to 3.4 moles per liter; and a complexing agent for cuprous ion, from about 0.00002 to 0.06 mole per liter; protecting designated areas of the foil and the lateral walls of the apertures from attack by an etchant; and etching the metal foil in the unprotected areas to form a predetermined conductor pattern.

7. In a process for making printed circuits on a member clad on at least one surface with metal foil and having an insulating core, with conductive passageways between the top and bottom surfaces of the member, the improvements which comprise providing apertures in the member; sensitizing the lateral walls surrounding the apertures to reception of electroless copper by treating with acidic aqueous solutions of stannous tin ions and precious metal ions; etching the metal foil in designated areas to provide a predetermined pattern of conductive metal foil supported on the insulating core; and immersing the resultant panel in a bath consisting essentially of: water; a water soluble copper salt, from about 0.002 to 0.15 mole per liter; a complexing agent for cupric ion, from about 0.5 to 2.5 times the moles of a copper salt; an alkali metal hydroxide, sufficient to give a pH of between about 10.5 to 14; formaldehyde, from about 0.06 to 3.4 moles per liter; and a complexing agent for cuprous ion, from about 0.00002 to 0.06 mole per liter; until a uniform deposit of electroless copper has formed on the lateral walls surrounding the apertures and on the metal foil forming the conductor pattern.

8. In a process for making printed circuits on a member clad on at least one surface with copper foil and having an insulating core, with conductive passageways between the top and bottom surfaces of the member, the improvements which comprise providing apertures in the member; sensitizing the lateral walls surrounding the apertures to reception of electroless copper by treating with aqueous solutions of stannous tin ions and precious metal ions; depositing electroless copper on the foil and on the lateral walls surrounding the apertures by immersing the member in a bath consisting essentially of: water; a water soluble copper salt, from about 0.002 to 0.15 mole per liter; a complexing agent for cupric ion, from about 0.5 to 2.5 times the moles of a copper salt; an alkali metal hydroxide, sufficient to give a pH of between about 10.5 to 14; formaldehyde, from about 0.06 to 3.4 moles per liter; and a complexing agent for cuprous ion, from about 0.00002 to 0.06 mole per liter; printing a pattern on the foil with an acid resist material, leaving the desired circuit pattern and the apertures exposed; depositing at least one additional metal selected from the group consisting of nickel, gold, silver, and rhodium, on the desired circuit pattern and the lateral walls of the apertures; removing the acid resist material; and etching the foil from those areas of the panel previously covered by the acid resist material.

9. The process of claim 8, wherein the panel following the electroless copper deposition is sensitized to the reception of electroless nickel deposit, and wherein the panel, following said sensitization, is electrolessly plated with nickel and, then, with gold.

10. In a method of making printed circuits, on an insulating member having conductive passageways through the member, the improvements which comprise imposing a conductor pattern on at least one surface of the insulating member; coating the surfaces of the member with a readily removable, acid resistant material; providing holes in designated areas of the member; sensitizing the lateral walls of the member surrounding the holes for the reception of electroless deposited copper; removing the inert coating; and electrolessly depositing copper on the conductor pattern and on the lateral walls of the panel surrounding the apertures by immersing the panel in an electroless copper depositing bath comprising: water; a water soluble copper salt, from about 0.002 to 0.15 mole per liter; a complexing agent for cupric ion, from about 0.5 to 2.5 times the moles of copper salt; an alkali metal hydroxide, sufficient to give a pH of between about 10.5 to 14; formaldehyde from about 0.06 to 3.4 moles per liter; and a complexing agent for cuprous ion, from about 0.00002 to 0.06 mole per liter.

11. The method of claim 10 wherein the insulating panel has metal foil on both surfaces, and wherein the foil on both surfaces is etched in designated areas to provide the conductor pattern.

12. A method of making conductive passageways in an insulating member having a conductor pattern on the surface thereof which comprises: providing apertures in the member at designated areas; sensitizing the lateral walls of the member surrounding the holes for reception of electroless deposited copper; coating the insulating member with a permanent solder mask while leaving the walls of the member surrounding the apertures exposed; and electrolessly depositing copper on the sensitized walls of the member surrounding the apertures by immersion in a bath comprising: water; a water soluble copper salt, from about 0.002 to 0.15 mole per liter; a complexing agent for cupric ion, from about 0.5 to 2.5 times the moles of copper salt; an alkali metal hydroxide, sufficient to give a pH of between about 10.5 to 14; formaldehyde from about 0.06 to 3.4 moles per liter; and a complexing agent for cuprous ion, from about 0.00002 to 0.06 mole per liter.

13. A method of making conductive passageways in an insulating member having a conductor pattern adhered to the surface thereof which comprises coating the surfaces of the panel with an inert acid resistant material; providing holes in designated areas of the panel; sensitizing the walls of the panel surrounding the holes for reception of electroless deposited copper by treatment with an acidic aqueous solution of stannous tin ions followed by treatment with an acidic aqueous solution of precious metal ions; removing the inert coating; and electrolessly depositing copper on the walls of the panel surrounding the apertures and on the conductor pattern by immersing the panel in an electroless copper depositing bath comprising: water; a water soluble copper salt, from about 0.002 to 0.15 mole per liter; a complexing agent for cupric ion, from about 0.5 to 2.5 times the moles of copper salt; an alkali metal hydroxide, sufficient to give a pH of between about 10.5 to 14; formaldehyde from about 0.06 to 3.4 moles per liter; and a complexing agent for cuprous ion, from about 0.00002 to 0.06 mole per liter.

14. A method of making printed circuits which comprises providing apertures in an insulating panel having copper cladding on both sides to define cross-overs between the top and bottom surfaces of the panel; sensitizing the lateral walls surrounding the apertures to reception of electrolessly deposited copper; coating the surfaces of the panel with a temporary mask, leaving the lateral walls surrounding the holes, including lands, exposed; immersing the panel in an electroless copper plating solution comprising: water; a water soluble copper salt, from about 0.002 to 0.15 mole per liter; a complexing agent for cupric ion, from about 0.5 to 2.5 times the moles of copper salt, an alkali metal hydroxide, sufficient to give a pH of between about 10.5 to 14; formaldehyde from about 0.06 to 3.4 moles per liter; and a complexing agent for cuprous ion, from about 0.00002 to 0.06 mole per liter; to form an adherent deposit of electroless copper on the lateral walls surrounding the holes and on the lands; coating the holes and the lands with a metal resistant to ferric chloride solution; stripping of the temporary resist from the surfaces of the panel; printing a permanent solder mask on the surfaces of the panel to define a circuit pattern; and etching the panel to remove the copper cladding from the portions of the surfaces of the panel not protected by the permanent solder mask.

15. The method of claim 14, including immersing the resulting panel in a molten solder bath to coat the lands surrounding the holes with solder.

16. A method of making conductive passageways in an insulating member clad on at least one surface with metal which comprises providing apertures in the member; sensitizing the lateral walls of the member surrounding the apertures to the reception of electrolessly deposited ductile metal; and electrolessly depositing ductile metal on the lateral walls surrounding the apertures by contacting said member with an electroless copper deposition solution comprising a water soluble copper salt; a complexing agent for cupric ion; a reducing agent for cupric ion; and a complexing agent for cuprous ion.

17. In a process for making conductive passageways between the top and bottom surfaces of an insulating member which is clad on at least one said surface with metal, the improvement which comprises providing apertures in the insulating member; sensitizing the lateral walls of the member surrounding the apertures to the reception of electrolessly deposited ductile metal; and electrolessly depositing ductile metal on the lateral walls of the member surrounding the apertures by contacting said member with an electroless copper deposition solution comprising a water soluble copper salt; a complexing agent for cupric ion; a reducing agent for cupric ion; and a complexing agent for cuprous ion.

18. In a process of making a printed circuit on an insulating member clad on at least one surface with metal, the improvement which comprises providing apertures in the member; sensitizing the lateral walls of the member surrounding the walls for reception of electrolessly deposited metal; removing metal in designated areas from said metal clad surface to form a predetermined conducting pattern on the surfaces of the member and electrolessly depositing ductile copper on the pattern and on the lateral walls surrounding the apertures by contacting said member with an electroless copper deposition solution comprising a water soluble copper salt; a complexing agent for cupric ion; a reducing agent for cupric ion; and a complexing agent for cuprous ion.

19. In a method of making printed circuits on a member clad on at least one surface with a metal foil and having an insulating core; the improvement which comprises providing apertures in the panel; sensitizing the later walls of the member surrounding the apertures for reception of electrolessly deposited ductile copper; electrolessly depositing copper on the foil and on the lateral walls of the member surrounding the apertures by contacting said member with an electroless copper deposition solution comprising a water soluble copper salt; a complexing agent for cupric ion; a reducing agent for cupric ion; and a complexing agent for cuprous ion; protecting designated areas of the foil and the lateral walls of the apertures from attack by an etchant; and etching the metal foil in the unprotected areas to form a predetermined conductor pattern.

20. In a process for making printed circuits on a member clad on at least one surface with metal foil and having an insulating core, with conductive passageways between the top and bottom surfaces of the member, the improvement which comprises providing apertures in the member; sensitizing the lateral walls surrounding the apertures to reception of electroless copper; etching the metal foil in designated areas to provide a predetermined pattern on the conductive metal foil supported on the insulating core; and electrolessly depositing ductile copper on the lateral walls surrounding the apertures and on the metal foil forming the conductive pattern by contacting said member with an electroless copper deposition solution comprising a water soluble copper salt; a complexing agent for cupric ion; a reducing agent for cupric ion; and a complexing agent for cuprous ion.

21. In a process for making printed circuits on a member clad on at least one surface with copper foil and having an insulating core, with conductive passageways between the top and bottom surfaces of the member, the improvement which comprises providing apertures in the member; sensitizing the lateral walls surrounding the apertures to reception of electroless copper; depositing electroless ductile copper on the foil and on the lateral walls surrounding the apertures by contacting said member with an electroless copper deposition solution comprising a water soluble copper salt; a complexing agent for cupric ion; a reducing agent for cupric ion; and a complexing agent for cuprous ion; printing a pattern on the foil with an acid resist material, leaving the desired circuit pattern and the apertures exposed; depositing at least one additional metal selected from the group consisting of nickel, gold, silver, and rhodium, on the desired circuit pattern and the lateral walls of the apertures; removing the acid resist material; and etching the foil from those areas of the panel previously covered by the acid resist material.

22. The process of claim 21 wherein the panel following the electroless copper deposition is sensitized to the reception of electroless nickel deposit, and wherein the panel, following said sensitization, is electrolessly plated with nickel and, then, with gold.

23. In a method of making printed circuits, on an insulating member having conductive passageways through the member, the improvement which comprises imposing a conductor pattern on at least one surface of the insulating member; coating the surfaces of the member with a readily removable, acid resistant material; providing holes in designated areas of the member; sensitizing the lateral walls of the member surrounding the holes for the reception of electroless deposited copper; removing the inert coating; and electrolessly depositing ductile copper on the conductor pattern and on the lateral walls of the panel surrounding the apertures by contacting said member with an electroless copper deposition solution comprising a water soluble copper salt; a complexing agent for cupric ion; a reducing agent for cupric ion; and a complexing agent for cuprous ion.

24. The method of claim 23 wherein the insulating panel has metal foil on both surfaces, and wherein the foil on both surfaces is etched in designated areas to provide the conductor pattern.

25. A method of making conductive passageways in an insulating member having a conductor pattern on the surface thereof which comprises providing apertures in the member at designated areas; sensitizing the lateral walls of the member surrounding the holes for reception of electroless deposited copper; coating the insulating member with a permanent solder mask while leaving the walls of the member surrounding the apertures exposed; and electrolessly depositing ductile copper on the sensitized walls of the member surrounding the apertures by contacting said member with an electroless copper deposition solution comprising a water soluble copper salt; a complexing agent for cupric ion; a reducing agent for cupric ion; and a complexing agent for cuprous ion.

26. A method of making conductive passageways in an insulating member having a conductor pattern adhered to the surface thereof which comprises coating the surfaces of the panel with an inert acid resistant material; providing holes in designated areas of the panel; sensitizing the walls of the panel surrounding the holes for reception of electroless deposited copper; removing the inert coating; and electrolessly depositing ductile copper on the walls of the panel surrounding the apertures and on the conductor pattern by contacting said member with an electroless copper deposition solution comprising a water soluble copper salt; a complexing agent for cupric ion; a reducing agent for cupric ion; and a complexing agent for cuprous ion.

27. A method of making printed circuits which comprises providing apertures in an insulating panel having copper cladding on both sides to define cross-overs between the top and bottom surfaces of the panel; sensitizing the lateral walls surrounding the apertures to reception of electrolessly deposited copper; coating the surfaces of the panel with a temporary mask, leaving the lateral walls surrounding the holes, including lands, exposed; electrolessly depositing ductile copper on the lands surrounding the holes and on the lateral walls by contacting said member with an electroless copper deposition solution comprising a water soluble copper salt; a complexing agent for cupric ion; a reducing agent for cupric ion; and a complexing agent for cuprous ion; coating the holes and the lands with a metal resistant to ferric chloride solution; stripping off the temporary resist from the surfaces of the panel; printing a permanent solder mask on the surfaces of the panel to define a circuit pattern; and etching the panel to remove the copper cladding from the portions of the surfaces of the panel not protected by the permanent solder mask.

28. The method of claim 27, including immersing the resulting panel in a molten solder bath to coat the lands surrounding the holes with solder.

29. A method of making conductive passageways in an insulating member which comprises providing apertures in the member; sensitizing the lateral walls of the member surrounding the apertures to the reception of electrolessly deposited copper; and electrolessly depositing copper on the lateral walls surrounding the apertures by contacting said member with an electroless copper deposition solution comprising a water soluble copper salt; a complexing agent for cupric ion; a reducing agent for cupric ion; and a complexing agent for cuprous ion.

References Cited by the Examiner

UNITED STATES PATENTS

| | | | |
|---|---|---|---|
| 2,897,409 | 7/1959 | Gitto | 117—212 |
| 2,938,805 | 5/1960 | Agens | 106—1 |
| 3,031,344 | 4/1962 | Sher et al. | 117—212 |
| 3,075,856 | 1/1963 | Lukes | 117—212 |
| 3,095,309 | 6/1963 | Zeblisky et al. | 106—1 |
| 3,119,709 | 1/1964 | Atkinson | 117—35 X |
| 3,134,690 | 5/1964 | Eriksson | 117—212 |
| 3,146,125 | 8/1964 | Schneble | 117—212 |

JOSEPH REBOLD, *Primary Examiner.*

ALEXANDER H. BRODMERKEL, RICHARD D. NEVIUS, *Examiners.*

J. E. CARSON, W. L. JARVIS, *Assistant Examiners.*